(12) United States Patent
Ko

(10) Patent No.: US 7,582,533 B2
(45) Date of Patent: Sep. 1, 2009

(54) LDMOS DEVICE AND METHOD FOR MANUFACTURING THE SAME

(75) Inventor: Choul Joo Ko, Seongnam-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 199 days.

(21) Appl. No.: 11/528,149

(22) Filed: Sep. 26, 2006

(65) Prior Publication Data

US 2007/0069308 A1 Mar. 29, 2007

(30) Foreign Application Priority Data

Sep. 28, 2005 (KR) ...................... 10-2005-0090682

(51) Int. Cl.
*H01L 21/336* (2006.01)
(52) U.S. Cl. ................... 438/286; 257/E21.427
(58) Field of Classification Search ......... 438/282, 438/286, 298, 545; 257/E21.427
See application file for complete search history.

(56) References Cited

U.S. PATENT DOCUMENTS

| 6,168,983 | B1 * | 1/2001 | Rumennik et al. ......... 438/188 |
| 6,933,560 | B2 * | 8/2005 | Lee et al. .................... 257/328 |
| 2002/0079521 | A1 | 6/2002 | Lin |
| 2004/0238913 | A1 | 12/2004 | Kwon et al. |

* cited by examiner

*Primary Examiner*—Chandra Chaudhari
(74) *Attorney, Agent, or Firm*—Saliwanchik, Lloyd & Saliwanchik

(57) ABSTRACT

Provided is a LDMOS device and method for manufacturing. The LDMOS device includes a second conductive type buried layer formed in a first conductive type substrate. A first conductive type first well is formed in the buried layer and a field insulator with a gate insulating layer at both sides are formed on the first well. On one side of the field insulator is formed a first conductive type second well and a source region formed therein. On the other side of the field insulator is formed an isolated drain region. A gate electrode is formed on the gate insulating layer on the source region and a first field plate is formed on a portion of the field insulator and connected with the gate electrode. A second field plate is formed on another portion of the field insulator and spaced apart from the first field plate.

10 Claims, 5 Drawing Sheets

LDMOS DEVICE AND METHOD FOR MANUFACTURING THE SAME

RELATED APPLICATION

This application claims the benefit under 35 U.S.C. §119(e) of Korean Patent Application Number 10-2005-0090682 filed Sep. 28, 2005, which is incorporated herein by reference in its entirety.

FIELD OF THE INVENTION

The present invention relates to an LDMOS device and method for manufacturing the same.

BACKGROUND OF THE INVENTION

Generally, a lateral diffused metal oxide semiconductor (LDMOS) device, which is a high voltage MOS device, is used as a power semiconductor device.

A device that can operate at a high voltage close to a theoretical breakdown voltage of a semiconductor is preferred as an ideal power semiconductor device. Accordingly, in a case where an external system using a high voltage is controlled by an integrated circuit (IC), the IC needs a high voltage control device built therein and configured to have a high breakdown voltage.

That is, in the case of a drain or source of a transistor to which a high voltage is directly applied, it is required that a punch through voltage between the drain/source and a semiconductor substrate and a breakdown voltage between the drain/source and a well or substrate be higher than the high voltage.

Among those high voltage semiconductor devices, the LDMOS device has a structure suitable for a high voltage because channel region and drain electrode thereof are separated with a drift region disposed therebetween and controlled by a gate electrode.

FIG. 1 is a sectional view of an LDMOS device according to the related art.

Referring to FIG. 1, the related art LDMOS device includes a first well 12 formed in a substrate 10, a field oxide 17 formed on a surface of the substrate 10, and source region 15 and drain region 16 formed in the surface of the first well 12 at both sides of the field oxide 17. The source region 15 and the drain region 16 are isolated at both sides of the field oxide 17 by the field oxide 17. During formation of the field oxide 17, a gate oxide 18 is formed on the surface of the substrate 10 at both sides of the field oxide 17.

A gate electrode 19a is formed on the gate oxide 18, and a field plate 19b is formed on the field oxide 17 and connected with the gate electrode 19a.

In FIG. 1, the symbol 'L' indicates a width of the field oxide 17, and a half pitch 'HP' indicates a distance between the source region 15 and the drain region 16.

The field plate 19b lowers a strong electric field at an edge of the gate electrode to increase the breakdown voltage, and decreases the resistance of the first well 12 to lower the On resistance 'Ron' of the LDMOS device.

To increase the breakdown voltage of the LDMOS device in the related art, there is a method of increasing the width 'L' of the field oxide 17. However, increasing the width 'L' causes the half pitch to be increased and the electric field at the edge of the gate electrode to also increase, so that the occurrence probability of a breakdown at the surface is increased and thus the On resistance 'Ron' is increased.

Also, because the related art LDMOS device separates the channel region and the drain electrode by a drift region and controls the drain current by a single gate, the drift region has a large On resistance and is not suitable for large current operation.

SUMMARY OF THE INVENTION

Accordingly, the present invention is directed to an LDMOS device and method for manufacturing the same that addresses and/or substantially obviates one or more problems, limitations, and/or disadvantages of the related art.

An object of the present invention is to provide an LDMOS device with an enhanced On resistance 'Ron' and breakdown voltage and a method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a lateral diffused MOS device including: a buried layer formed in a first conductive type substrate and doped with a second conductive type impurity; a first well formed in the buried layer and doped with the first conductive type impurity; a field insulator formed on a surface of the first well; a gate insulating layer formed on a surface of the first well at both sides of the field insulator; a second well formed in the first well at one side of the field insulator and doped with the first conductive type impurity; a source region formed in a surface of the second well; a drain region isolated from the source region and formed in the surface of the first well at the other side of the field insulator; a gate electrode formed on the gate insulating layer on the source region; a first field plate formed on a predetermined portion of the field insulator and connected with the gate electrode; and a second field plate formed on another predetermined portion of the field insulator and spaced apart by a predetermined spacing from the first field plate.

In another aspect of the present invention, there is provided a method for manufacturing a lateral diffused MOS device, the method including: forming a buried layer doped with a second conductive type impurity in a first conductive type substrate; forming a first well doped with the first conductive type impurity in the buried layer; forming a field insulator on a surface of the first well; forming a gate insulating layer on a surface of the first well at both sides of the field insulator; forming a second well doped with the first conductive type impurity in the first well at one side of the field insulator; forming a source region in a surface of the second well; forming a drain region isolated from the source region in the surface of the first well at the other side of the field insulator; forming a gate electrode on the gate insulating layer on the source region; forming a first field plate connected with the gate electrode on a predetermined portion of the field insulator; and forming a second field plate spaced apart by a predetermined spacing from the first field plate on another predetermined portion of the field insulator.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will be made in detail to the preferred embodiments of the present invention, examples of which are illustrated in the accompanying drawings.

Figure 1:
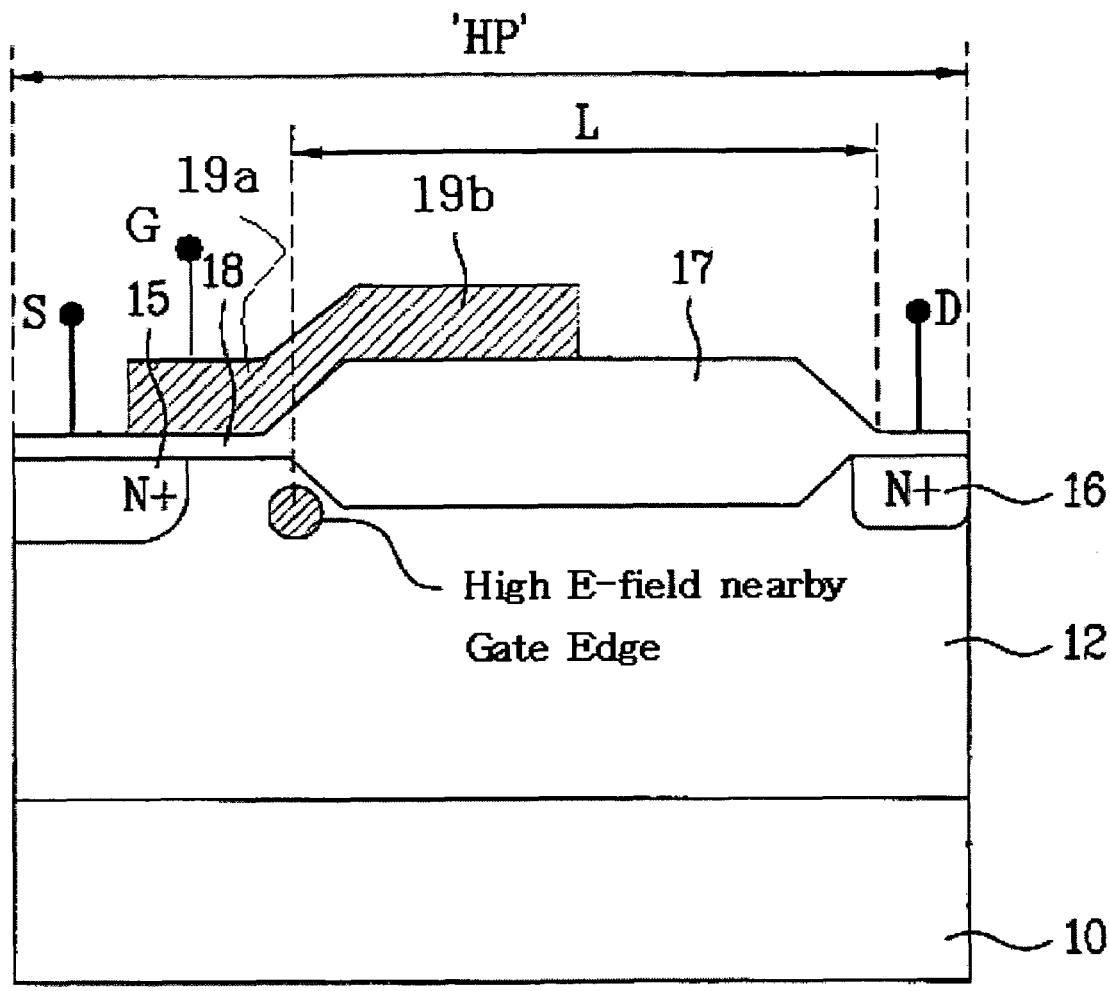
FIG. 1 is a sectional view of an LDMOS device according to the related art.
Figure 2:
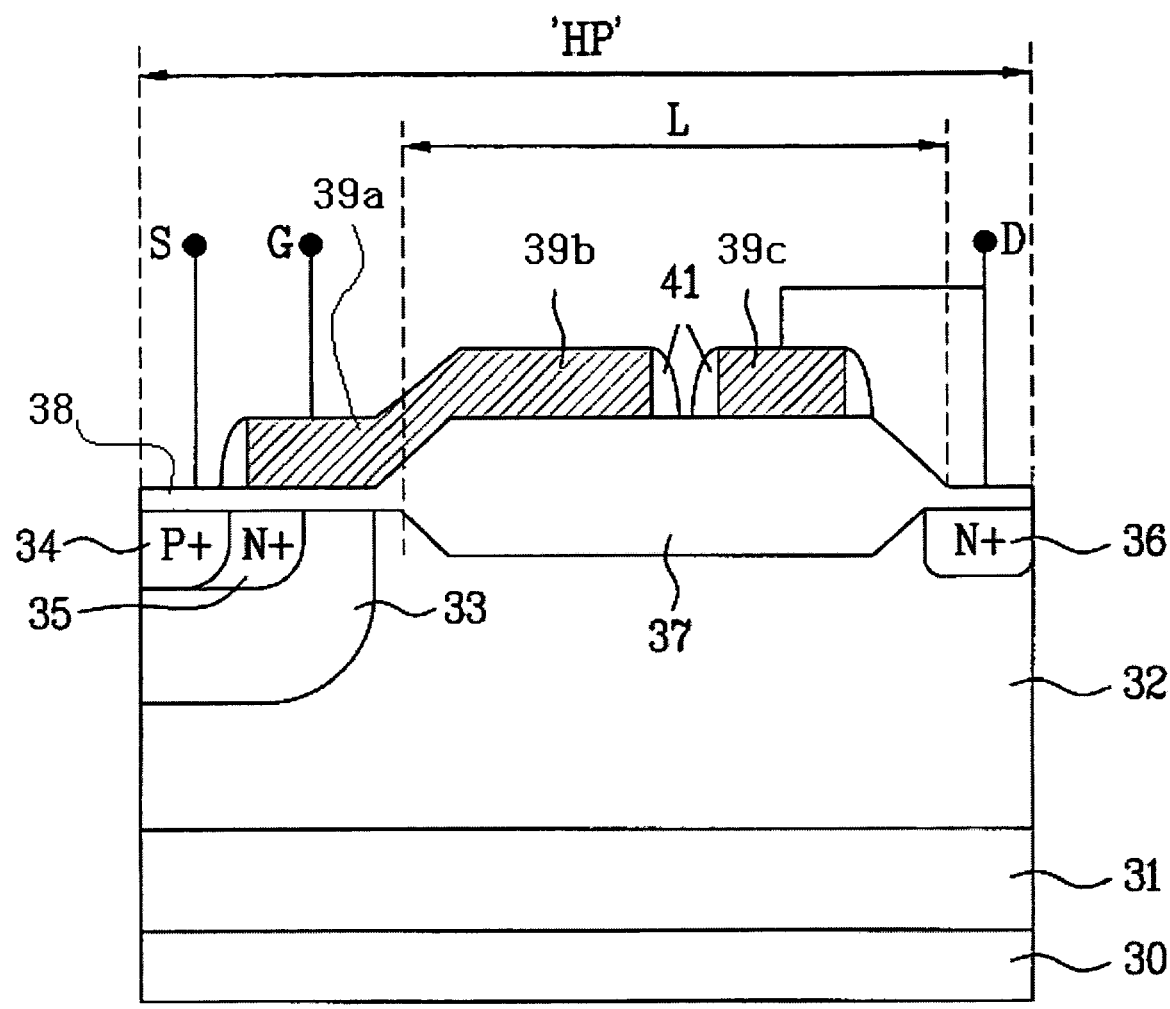
FIG. 2 is a sectional view of an LDMOS device according to an embodiment of the present invention.

FIG. 2 is a sectional view of an LDMOS device according to an embodiment of the present invention.

While the following embodiments describe the first conductive type as P-type and the second conductive type as N-type, the present invention is not construed to be limited thereto.

Referring to FIG. 2, in an LDMOS device according to an embodiment of the present invention, a buried layer 31 doped with a second conductive type (N-type) impurity can be formed in a first conductive type (P-type) substrate 30, and a first well 32 doped with the first conductive type (P-type) impurity can be formed in the buried layer 31.

A field insulator 37 can be formed on a surface of the first well 32 of the substrate 30, and a second well 33 doped with the first conductive (P-type) impurity can be formed in the first well 32.

A first doping region 34 doped with a high concentration first conductive type impurity (P+) can be formed in a surface of the second well 33, and a source region 35 doped with a high concentration second conductive type impurity (N+) can be formed in the surface of the second well 33 adjacent to the first doping region 34.

A drain region 36 spaced apart from the source region 35 can be formed in the surface of the first well 32 at the other side of the field insulator 37. As aforementioned, the source region 35 and the drain region 36 are isolated by the field insulator 37. A gate insulating layer 38 can be formed on an entire upper surface of the substrate 30 except for the field insulator 37.

A gate electrode 39a can be formed on the gate insulating layer 38 on the source region 35, and a first field plate 39b connected with the gate electrode 39a can be formed on a portion of the field insulator 37.

Also, a second field plate 39c spaced apart a predetermined distance from the first field plate 39b can be formed on another portion of the field insulator 37.

In a specific embodiment, the gate electrode 39a, the first field plate 39b and the second field plate 39c can be formed of the same material, for example, polysilicon.

The present embodiment is characterized in that a bias applied to the second field plate 39c is different from a bias applied to the first field plate 39b.

That is, the bias applied to the second field plate 39c is the same as that applied to the drain region 36; thereby the bias applied to the second field plate 39c is different from the bias applied to the gate electrode 39a.

In a further embodiment, sidewall spacers 41 can be formed on the gate electrode 39a, the first field plate 39b and the second field plate 39c.

Accordingly, the second field plate 39c can be formed isolated from the first field plate 39b and a drain bias can be applied to the second field plate 39c such that the bias of the second field plate 39c is not biased with the gate electrode 39a, as in the case with the first field plate 39b, thereby enabling a LDMOS device to be designed with a high breakdown voltage and a low On resistance 'Ron'.

In addition, the second field plate 39c, which is isolated from the first field plate 39b, can be formed without extending the width 'L' of the gate insulating layer 37 unlike in the related art, thereby enabling a LDMOS device to be designed with a higher breakdown voltage than that of the related art and a lower On resistance 'Ron' than that of the related art.

Further, the drain bias can be applied to the second field plate 39c and thus the electric field in an edge of the gate electrode 39a can be lowered.

Hereinafter, a method of manufacturing an LDMOS device according to an embodiment of the present invention will be described.

Figure 3:
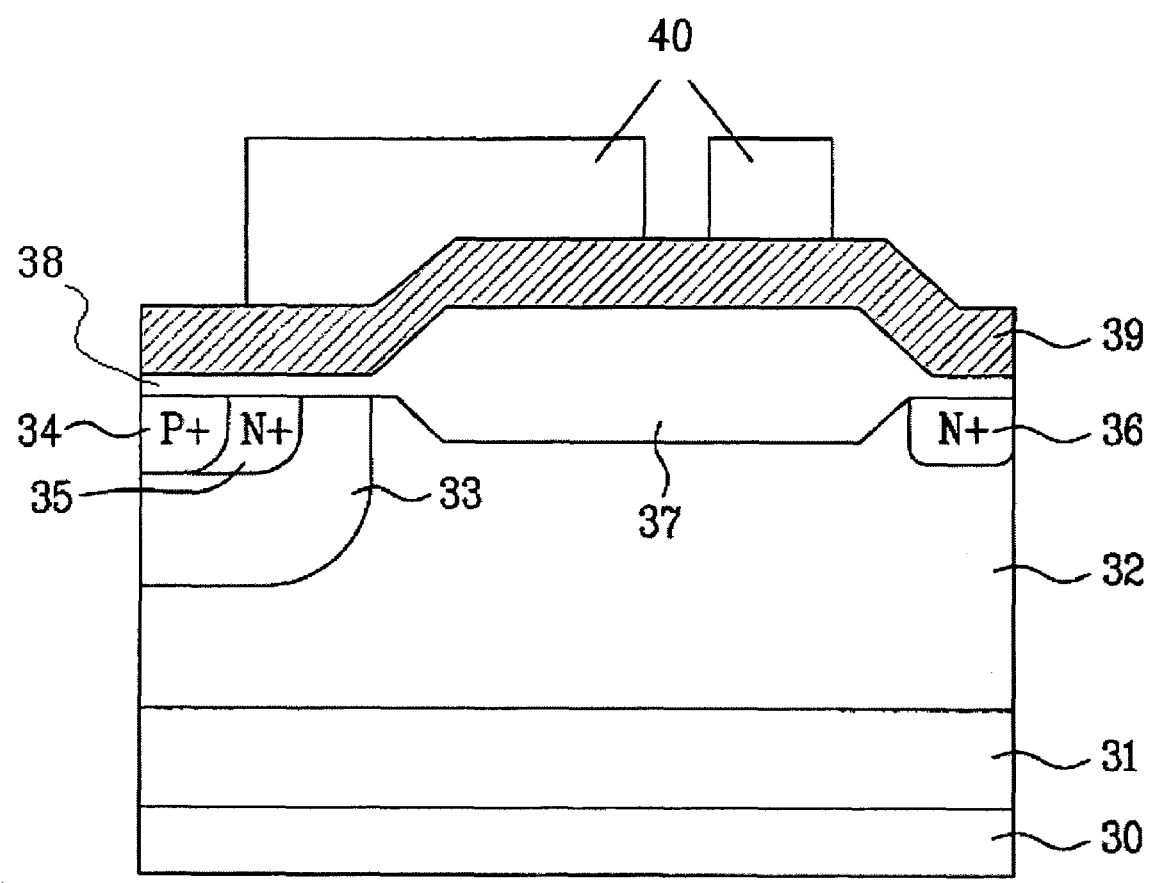
FIGS. 3 through 5 are sectional views illustrating a method of manufacturing an LDMOS device according to an embodiment of the present invention.
Figure 4:
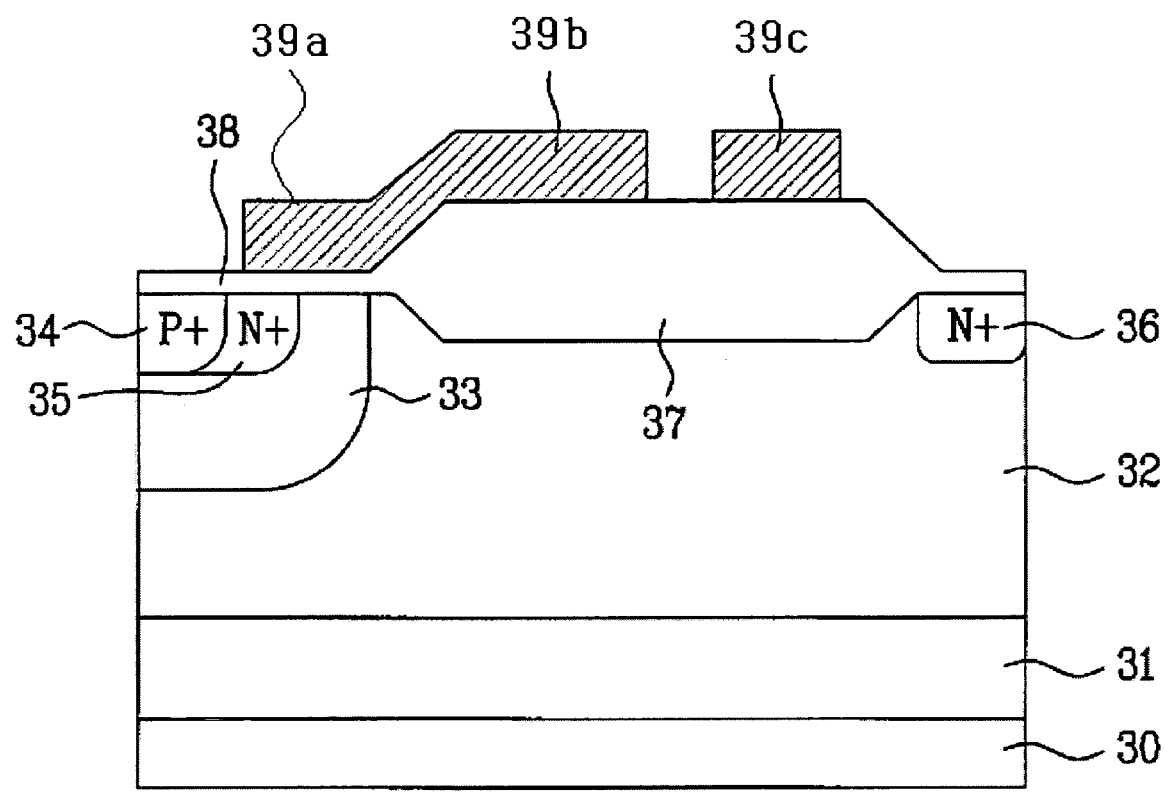
Figure 5:
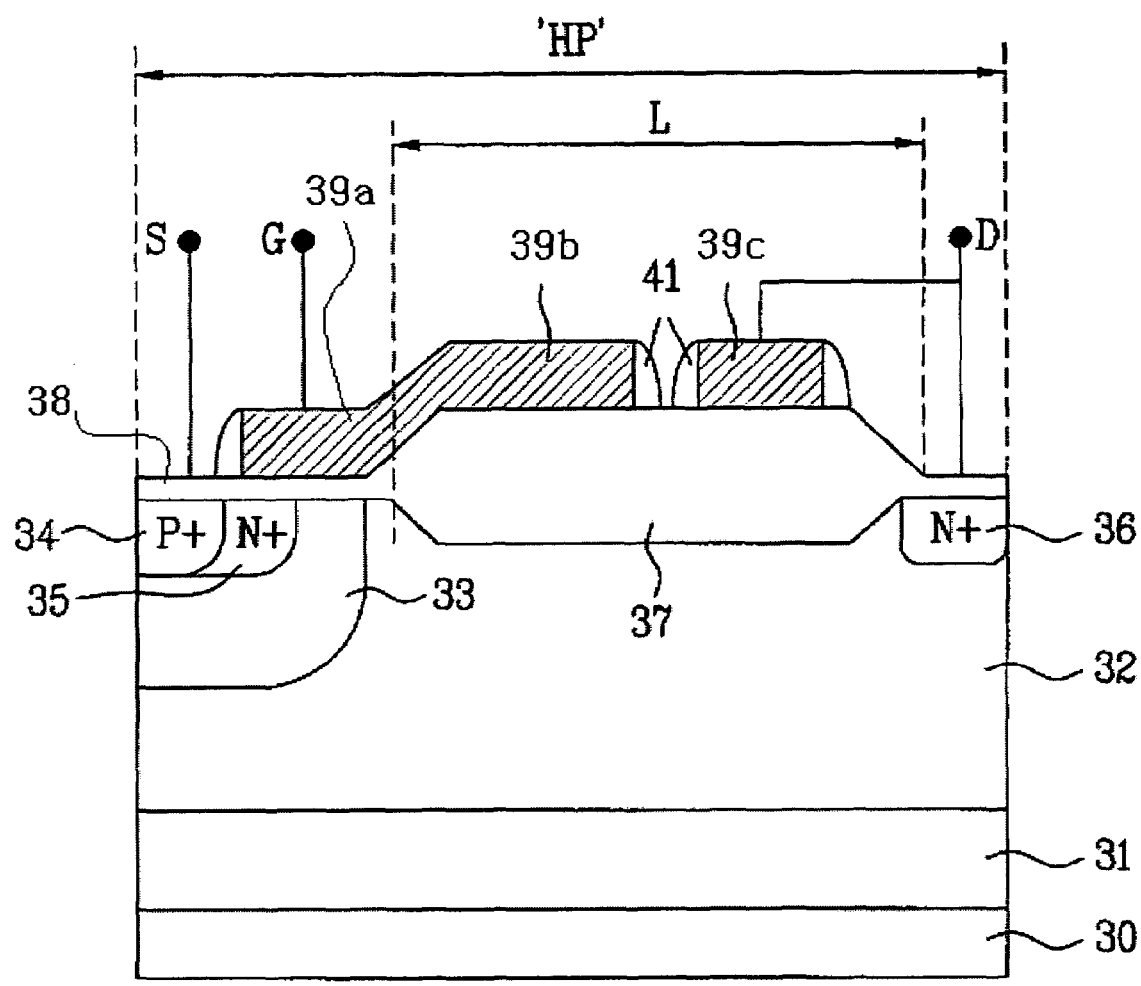

FIGS. 3 through 5 are sectional views illustrating a method of manufacturing an LDMOS device according to an embodiment of the present invention.

First referring to FIG. 3, a buried layer 31 doped with a second conductive type (N-type) impurity can be formed in a first conductive type (P-type) substrate 30, and a first well 32 doped with the first conductive type (P-type) impurity can be formed in the buried layer 31.

A field insulator 37 can be formed on a surface of the first well 32 of the substrate 30, and a gate insulating layer 38 is formed on a surface of the first well 32 at both sides of the field insulator 37.

In one embodiment, the gate insulating layer 38 can be formed on an entire upper surface of the substrate 30 except for the field insulator 37.

As one embodiment example, the gate insulating layer 38 and the field insulator 37 can be formed as follows.

First, a pad oxide layer (not shown) can be formed on an entire upper surface of the substrate 30, and an insulating layer (not shown) can be formed to a thickness range of 4000-8000 Å by depositing an oxide layer on the pad oxide layer or growing a thermal oxide layer on the pad oxide layer.

Thereafter, a photoresist pattern (not shown) to expose a gate insulating layer region can be formed on the insulating layer, and the exposed insulating layer can be etched using the photoresist pattern as an etch mask to expose a surface of the substrate 30 corresponding to the gate insulating layer region and at the same time form the field insulator 37. The field insulator 37 functions to prevent an electric field from being concentrated on the drain, thereby enhancing the voltage-resistance property.

Next, the photoresist pattern can be removed, and the resultant substrate 30 is subject to a thermal oxidation process to form a gate insulating layer 38.

After the gate insulating layer 38 and field insulator 37 are formed, a second well 33 doped with the first conductive type (P-type) impurity can be formed in the first well 32 at one side of the field insulator 37, and a first doping region 34 doped with the high concentration first conductive type (P+) impurity can be formed in the surface of the second well 33.

Next, source region 35 and drain region both doped with the high concentration second conductive type (N+) impurity can be formed in a region adjacent to the first doping region 34 and in the surface of the first well 32 spaced apart from the first doping region 34, respectively. As a result, the source region 35 and the drain region 36 are formed at both sides of the field insulator 37 and isolated from each other.

A polysilicon layer 39 can be formed on an entire surface of the resultant substrate 30 having the aforementioned elements.

Then, a photoresist film 40 can be formed on the polysilicon layer 39, and selectively patterned by an exposure and development process to expose a predetermined portion of the field insulator 37. The photoresist film 40 can also be patterned to partially expose the polysilicon layer 39 on the source region 35 and the drain region 36.

Next, referring to FIG. 4, the polysilicon layer 39 can be etched using the patterned photoresist film 40 as an etch mask to form a gate electrode 39a, a first field plate 39b and a second field plate 39c.

That is, in an embodiment, the gate electrode 39a, the first field plate 39b and the second field plate 39c can be formed at the same time by etching the exposed polysilicon layer 39 using the single patterned photoresist film 40.

In embodiment, the photoresist pattern 40 can be patterned using one mask.

In a specific embodiment, the gate electrode 39a, the first field plate 39b and the second field plate 39c can be formed of the same material, i.e., polysilicon.

Of course, the gate electrode 39a, the first field plate 39b and the second field plate 39c may be formed by different methods with a time interval between the formation of each.

Accordingly, the bias applied to the second field plate 39c can be different from the bias applied to the first field plate 39b.

That is, the bias applied to the second field plate 39c can be the same as that applied to the drain region 36, and therefore is different from the bias applied to the gate electrode 39a.

Next, referring to FIG. 5, an insulating layer (not shown) can be deposited on an entire surface of the resultant substrate 30 and can be anisotropically etched to form sidewall spacers 41 on the gate electrode 39a, the first field plate 39b, and the second field plate 39c.

In FIG. 5, symbol 'L' indicates the width of the field insulator 37, and symbol 'HP' (half pitch) indicates the distance between the source region 35 and the drain region 36.

It should be noted that the above embodiment can use P-type as the second conductive type and N-type as the first conductive type.

In an embodiment, the second field plate 39c can be formed simultaneously with the gate electrode 39a and the first field plate 39b while the gate electrode 39a and the first field plate 39b are formed, thereby enabling a LDMOS device to be designed with a higher breakdown voltage and a lower On resistance 'Ron' without an additional process.

Also, according to an embodiment, the second field plate 39c can be formed isolated from the first field plate 39b, and a drain bias can be applied to the second field plate 39c, which is unlike the bias of the gate electrode 39a, thereby enabling a LDMOS device to be designed with a higher breakdown voltage and a lower On resistance 'Ron'.

Further, according to an embodiment, the second field plate 39c can be isolated from the first field plate 39b without extending the width 'L' of the gate insulating layer 37, unlike in the related art, thereby enabling a LDMOS device to be designed with a higher breakdown voltage and a lower On resistance 'Ron'.

Furthermore, according to an embodiment, the drain bias can be applied to the second field plate 39c and thus the electric field in an edge of the gate electrode 39a can be lowered.

It will be apparent to those skilled in the art that various modifications and variations can be made in the present invention. Thus, it is intended that the present invention covers the modifications and variations of this invention provided they come within the scope of the appended claims and their equivalents.

I claim:

1. A method for manufacturing a lateral diffused MOS device, the method comprising:
    forming a buried layer doped with a second conductive type impurity in a first conductive type substrate;
    forming a first well doped with the first conductive type impurity in the buried layer;
    forming a field insulator on a surface of the first well;
    forming a gate insulating layer on a surface of the first well at both sides of the field insulator;
    forming a second well doped with the first conductive type impurity in the first well at one side of the field insulator;
    forming a source region in a surface of the second well;
    forming a drain region isolated from the source region in the surface of the first well at the other side of the field insulator;
    forming a gate electrode on the gate insulating layer on the source region;
    forming a first field plate connected with the gate electrode on a predetermined portion of the field insulator; and
    forming a second field plate spaced apart by a predetermined spacing from the first field plate on another predetermined portion of the field insulator.

2. The method according to claim 1, wherein the gate electrode, the first field plate and the second field plate are formed at the same time.

3. The method according to claim 1, wherein the gate electrode, the first field plate and the second field plate are formed using a same mask.

4. The method according to claim 1, wherein the gate electrode, the first field plate and the second field plate are formed of a same polysilicon material.

5. The method according to claim 1, wherein forming the gate electrode, the first field plate, and the second field plate comprises:
    forming a polysilicon layer on an entire surface of the substrate including the gate insulating layer and the field insulator;
    forming a photoresist pattern exposing the polysilicon layer on a predetermined portion of the source region, the drain region and the field insulator; and
    etching the polysilicon layer using the photoresist pattern as a mask.

6. The method according to claim 1, further comprising forming sidewall spacers on the gate electrode, the first field plate, and the second field plate.

7. The method according to claim 1, wherein the first conductive type is P-type and the second conductive type is N-type.

8. The method according to claim 1, further comprising forming a first doping region doped with the first conductive type impurity in the surface of the second well.

9. The method according to claim 1, wherein the source region is doped with the second conductive type impurity.

10. The method according to claim 1, wherein the second field plate is formed such that a bias applied to the second field plate is different from a bias applied to the first field plate.

* * * * *